March 15, 1966 J. H. GUYTON 3,241,088
TRANSISTOR OSCILLATOR FEEDBACK CIRCUIT
Filed Jan. 12, 1956
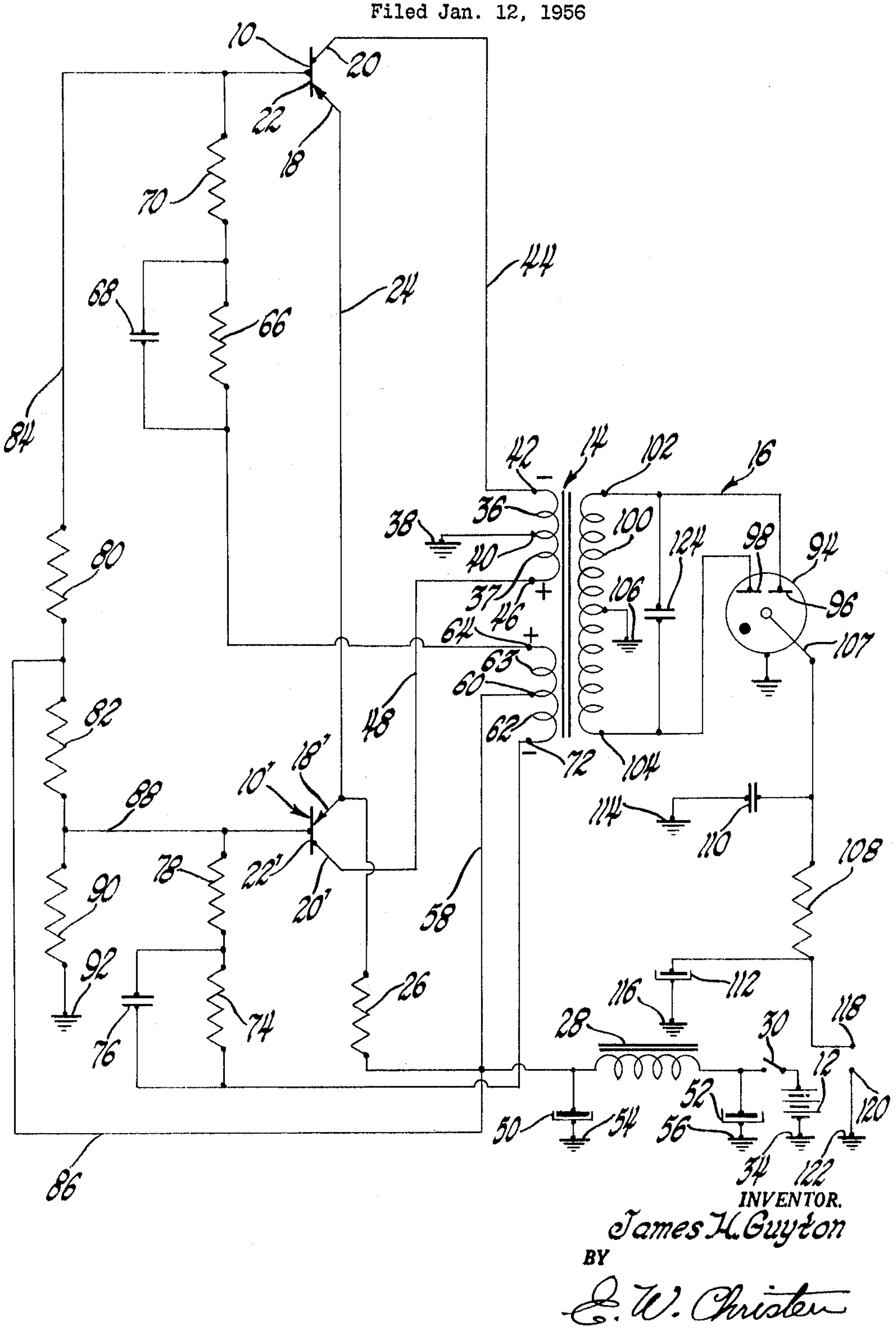
INVENTOR.
James H. Guyton
BY
E. W. Christen
ATTORNEY.

3,241,088
Patented Mar. 15, 1966

3,241,088

TRANSISTOR OSCILLATOR FEEDBACK CIRCUIT

James H. Guyton, Kokomo, Ind., assignor to General Motors Corporation, Detroit, Mich., a corporation of Delaware Filed Jan. 12, 1956, Ser. No. 558,763
5 Claims. (Cl. 331—114)

This invention relates to transistor oscillator circuits and more particularly to feedback oscillators of the blocking type which may be connected in push-pull arrangement.

In transistor oscillators employing an inductance such as a transformer winding in the output circuit, the transistor device is subject to a high inverse voltage between electrodes upon collapse of the magnetic field of the inductance. As is well known, excessively high voltages impressed across transistor electrodes have a destructive effect upon the transistor. This effect is especially pronounced in transistor oscillators of the type employing inductive feedback coupling between output and input circuits and transformer coupling to a succeeding stage, such as that described and claimed in United States application S.N. 512,176 for "Transistor Power Oscillator," filed May 31, 1955, now Patent No. 2,925,560 by James H. Guyton and Kenneth S. Vogt and assigned to the assignee of the present invention.

In utilizing a transistor oscillator as a power supply, such as the plate voltage supply for electron tube circuits and similiar applications, it is desirable to operate the oscillator at high power output. For supplying high power at good efficiency the advantages of the so-called push-pull or double ended connection have long been recognized. However, provision must be made to avoid excessive inverse voltages on the transistor electrodes and to ensure operation within the current and forward voltage ratings of the transistors. A push-pull transistor oscillator having features in common with the present invention is disclosed, but not claimed per se, in United States application S.N. 546,547 for "Transistor Oscillator Starting Circuit," filed November 14, 1955, by James H. Guyton and assigned to the assignee of the present invention.

Accordingly, an object of this invention is to provide an improved push-pull transistor oscillator adapted to furnish high power without exceeding the voltage and current ratings of the transistors.

A further object of this invention is to provide a push-pull transistor oscillator which inherently limits the inverse voltages on the transistor electrodes.

An additional object is to provide a transistor oscillator of the feedback type in which the feedback current to the transistor is regulated to permit operation at high power without overloading the transistor.

Another object is to provide a transistor oscillator which is relatively insensitive to variations in transistor operating temperature.

In the accomplishment of these objects there is provided a transistor oscillator circuit connected in push-pull in which a pair of transistors are alternately conductive. The output circuit of each transistor, during the non-conductive interval of its cycle, supplies an input voltage and current to initiate the conductive interval of the output circuit of the other transistor. This is effective to reduce the inverse voltage across the transistor electrodes during the non-conductive interval. Circuit means are provided to regulate the input current to each transistor to permit operation throughout the conductive interval of the transistor within its current and voltage rating.

A more complete understanding of the invention may be had from the detailed description which follows taken with the accompanying drawings in which the single figure is a schematic circuit diagram of an illustrative embodiment of the inventive transistor oscillator connected in a push-pull arrangement. As illustrated, the oscillator may be employed, if desired, with a suitable reversal of a relatively high direct voltage from a low direct voltage source. In general, the oscillator comprises a pair of transistors 10 and 10′, energized from a voltage source or battery 12, which supply alternating current to an output transformer 14. A rectifier circuit 16 is energized from the transformer 14.

The transistors 10 and 10′ each includes, respectively, an emitter electrode 18 and 18′, collector electrode 20 and 20′, and base electrode 22 and 22′. Both transistors in the illustrative embodiment are of the junction type and are of the P–N–P configuration in which the emitter and collector electrodes are of P type material having holes as majority carriers and the base electrodes are of N type material having electrons as majority carriers. It will be apparent that the transistors may be either point contact or junction type and that an N–P–N configuration may be employed suitably with a rectifier for developing polarities.

The output circuits of the transistors 10 and 10′ are connected in push-pull fashion with the primary windings 36 and 37 of transformer 14 and the voltage suorce 12. The output circuit of transistor 10 extends from the emitter electrode 18, through conductor 24, emitter circuit resistor 26, and an inductance or choke coil 28, to the starting switch 30. From the switch 30 the circuit extends to the positive terminal of the voltage source or battery 12 and thence to a point of reference potential or ground 34. The output circuit of transistor 10 is completed through the primary winding 36 of output transformer 14 by connection from ground 38 to center-tap 40 and thence from terminal 42 through conductor 44 to collector electrode 20′ through primary winding 37 by transistor 10′ extends from the emitter electrode 18′ through emitter resistor 26, choke coil 28, switch 30 and battery 12 to ground 34. The circuit is completed to the collector electrode 20. Similarly, the output circuit of connection from ground 38 to center-tap 40, and thence from terminal 46 through conductor 48 to collector electrode 20′.

It is noted that the emitter to collector circuits of transistors 10 and 10′ include a common path through the emitter resistor 26, choke coil 28, switch 30, and battery 12. A pair of condensers 50 and 52 are connected from opposite terminals of choke coil 28 to ground connections 54 and 56, respectively. These condensers, which are suitably of the electrolytic type together with the choke coil form a pi section, low pass filter which eliminates any high frequency components generated in the oscillator. This arrangement prevents such components from reaching associated circuits which also may be energized from the battery 12. The resistor 26 is of low value relative to the emitter resistance of the transistors 10 and 10′ and introduces some degeneration in emitter circuits for stability of the oscillator with temperature variations.

The input circuit of each transistor includes a feedback circuit which is energized from the output circuit of the other transistor and extends between the emitter and base electrodes. The emitter electrodes 18 and 18′ of transistors 10 and 10′ are connected together by conductor 24 and thence through resistor 26 and conductor 58 to the tap 60 intermediate the feedback windings 62 and 63 of transformer 14. The feedback windings are inductively coupled to the primary windings 36 and 37 for energization thereby. The feedback circuit for transistor 10 extends from the terminal 64 of the feedback winding 63 to the base electrode 22 through the parallel circuit of resistor 66 and condenser 68 and the series resistor 70. The feedback circuit for the transistor 10′ extends to the base electrode 22′ by connection of the terminal 72 of feedback winding 62 through the parallel connected resistor 74 and condenser 76 and the series resistor 78. The resistors 66 and 74 are of considerably greater magnitude than the resistors 70 and 78, preferably by a factor of the order of ten to twenty. As a result, the feedback current to transistors 10 and 10′ is limited at its final value of build-up by the series combination of the resistors 66 and 70, and resistors 74 and 78, respectively. However, the initial value of feedback current to the transistors 10 and 10′ is limited primarily by the resistors 70 and 78, since the resistors 66 and 74 are shunted by condensers 68 and 76, respectively, which present an initially low impedance path to the feedback current until a charge is accumulated thereon. Therefore the feedback circuits provide a maximum permissible feedback current and a correspondingly maximum output current within the voltage and current ratings of the transistors.

The input circuit of each transistor also includes a low resistance path from emitter to base electrodes which is effective to maintain the operation within the voltage and current ratings of the transistors as the transistor operating temperatures increase. An increase of collector current with temperature, other factors remaining constant, is inherent in transistors and may lead to thermal runaway and ultimate destruction of the transistor unless compensation is provided. For this purpose a resistor 80 is connected between base electrode 22 and emitter electrode 18 through conductors 84 and 86, and resistor 26. Similarly, resistor 82 is connected between base electrode 22′ and emitter electrode 18′ through conductors 88 and 86, and resistor 26. The resistors 80 and 82 are of low value and provide degeneration in the input circuits which increases with the output circuit current to maintain a limiting value thereof.

The circuit arrangement for starting the oscillator includes a resistor 90 connected between conductor 88 and ground connection 92. This completes a circuit from the positive terminal of battery 12, through switch 30, coil 28, resistor 26, emitter electrode 18′, base electrode 22′ and conductor 88 to ground connection 92. Similarly, a circuit of greater resistance is completed from battery 12, through switch 30, coil 28, resistor 26, emitter electrode 18, base electrode 22, and resistors 80, 82, and 90 to ground 92. Thus, the starting current supplied to the input circuit of transistor 10′ predominates over that of transistor 10 upon closing switch 30.

The output of the oscillator is coupled by transformer 14 to the full-wave rectifier circuit 16. The rectifier circuit suitably comprises a dual diode 94 having plate electrodes 96 and 98 connected to the transformer secondary winding 100 at terminals 102 and 104, respectively. The secondary winding has a center-tap connected to ground 106. A buffer condenser 124 is connected across the secondary winding terminals 102 and 104. The cathode 107 is connected to resistor 108 which is associated with condensers 110 and 112 provided with ground connections 114 and 116, respectively, to form a low pass filter section. The rectified output voltage appears across terminal 118 and the terminal 120 having a ground connection 122.

In operation, the generation of oscillations is initiated by closing the starting switch 30. This completes the aforementioned starting circuit from the positive terminal of the battery 12 through the emitter and base electrodes of transistor 10′, and resistor 90, to the negative terminal of the battery through the ground connections. This permits a small starting current to flow in the low impedance direction from emitter electrode 18′ to base electrode 22′ which permits an output current to flow from battery 12 through emitter electrode 18′ to collector electrode 20′ and thence through conductor 48 and primary winding 37 to ground 38. This current in the output circuit of transistor 10′ induces a voltage in feedback windings 62 and 63 by virtue of inductive coupling with primary windings 36 and 37. The relative polarity of the voltages across the primary winding 37 and feedback winding 62, at this instant of operation, is as indicated in the drawings. The induced feedback voltage causes the current to increase in the input circuit of transistor 10′ causing further increase in the output circuit current. The circuit for the feedback current may be traced from the tap 60 through conductor 58, resistor 26, emitter electrode 18′, base electrode 22′, resistor 78, parallel connected resistor 74 and condenser 76, and back to terminal 72 of the feedback winding 62. The feedback current is limited initially by the small resistor 78 and finally by the larger series resistor 74, as previously described. The output current reaches a maximum value, as determined by the circuit parameters, and the feedback voltage decreases to zero. The output circuit current through primary winding 37 decreases abruptly terminating the conductive interval of the cycle for transistor 10′.

When the output circuit current in winding 37 decreases, the magnetic field of the transformer starts to collapse reversing the polarity of the voltage between the terminal 46 and tap 40. This tends to cause a high inverse voltage across the electrodes of transistor 10′ during the non-conductive interval of the cycle of transistor 10′. However, the voltage across the feedback winding 63 is also reversed during this interval and causes an input current to transistor 10 in the low impedance direction between emitter electrode 18 and base electrode 22. This current flow through the low impedance circuit is effective to dissipate the energy stored in the magnetic field of transformer 14 and to thereby limit the inverse voltage on the electrodes of transistor 10′ to a non-destructive value.

The current flow in the input circuit of transistor 10, during the non-conductive interval of transistor 10′, initiates conduction in the output circuit of transistor 10 through the primary winding 36. As a result, a feedback voltage is induced in feedback winding 63 between terminal 64 and tap 60 which, at this instant of operation, is the reverse of the polarity indicated in the drawings. The conductive interval for the transistor 10 terminates with the collapse of the magnetic field of transformer 14, in the same manner as described with respect to transistor 10′. The second half-cycle of the oscillator is thus terminated. During the non-conductive interval of the transistor 10, the induced voltage in feedback winding 62 is reversed again, causing a current to flow in the input circuit of the transistor 10′ in the low impedance direction between emitter electrode 18′ and base electrode 22′. This current flow is effective to limit the inverse voltage developed across the electrodes of transistor 10. The second cycle of the oscillator is initiated by the input current to transistor 10′ and the action just described is repetitive at a high rate to provide sustained oscillations in the primary winding of transformer 14.

The voltage induced in the secondary winding 100 is rectified in a known manner by the circuit 16. The output direct voltage appearing across output terminals 118 and 120 may be applied to any desired utilization device.

Although this description has been given with respect to a particular embodiment, it is not to be construed in a limiting sense upon the scope of the invention. Many variations and modifications within the spirit and scope of the invention will now occur to those skilled in the art. For a definition of the invention, reference is made to the appended claims.

I claim:

1. In a transistor oscillator of the type comprising a pair of transistors, an output transformer having a pair of primary winding portions with a common tap, a voltage source, an output circuit for each transistor extending between the collector and one of the other electrodes thereof, each of the output circuits including a different one of the primary winding portions and the voltage source, a pair of feedback windings on the transformer, an input circuit for each of the transistors extending between the base and one of the other electrodes and including one of the feedback windings in a regenerative connection, said oscillator being characterized by alternate switching of the transistor between conduction and non-conduction by the feedback voltage, the improvement comprising a resistor and condenser connected in parallel, in the input circuit of each transistor whereby the condenser permits the feedback voltage to produce a feedback current of high value during the switching of the respective transistor to conduction and the resistor limits the final value of feedback current during conduction.

2. In a transistor oscillator of the type comprising a voltage source, a transistor having emitter, collector and base electrodes, a transformer having first and second inductively coupled windings, an output circuit extending between the collector and one of the other electrodes and including the voltage source and the first winding, an input circuit extending between the base and one of the other electrodes and including the second winding in a regenerative feedback connection, said oscillator being characterized by alternate switching of the transistor between conduction and non-conduction by the feedback voltage, the improvement comprising a resistor and condenser connected in parallel in the input circuit, the charging circuit for said condenser having a time constant which is short compared to the conduction interval of the transistor whereby the condenser permits the feedback voltage to produce a feedback current of high value during the switching of the transistor to conduction and the resistor limits the final value of feedback current during conduction and whereby the voltage across the condenser decreases the feedback current during the switching of the transistor to non-conduction.

3. In a transistor oscillator of the type comprising a voltage source, a transistor having emitter, collector and base electrodes, a transformer having first and second inductively coupled windings, an output circuit extending between the collector and one of the other electrodes and including the voltage source and the first winding, an input circuit extending between the base and one of the other electrodes and including the second winding in a regenerative feedback connection, said oscillator being characterized by alternate switching of the transistor between conduction and non-conduction by the feedback voltage, the improvement comprising first and second series resistors connected in the input circuit, a condenser connected in parallel with the second series resistor, the charging circuit for said condenser having a time constant which is short compared to the conduction interval of the transistor whereby the condenser permits the feedback voltage to produce a feedback current of initial value limited by said first series resistor during the switching of the transistor to conduction and the first and second series resistors limit the final value of feedback current during conduction.

4. A pulse generating circuit arrangement comprising a transistor having emitter, collector and base electrodes, transformer means interconnecting said electrodes in feedback relationship, a resistor element arranged in feedback relationship in the connection between said base electrode and said transformer means, part of the voltage produced in said transformer means being fed back to said base electrode through said resistor element, and means for supplying pulses from said transformer means to a point between said base electrode and said resistor element, said pulse supplying means comprising an impedance member having a relatively low impedance to the leading edges of said pulses and having a relatively high impedance at the repetition frequency of the said pulses.

5. A pulse generating circuit arrangement comprising a transistor having emitter, collector and base electrodes, transformer means interconnecting said electrodes in feedback relationship, a resistor element connected in series circuit arrangement with a portion of said transformer means between said emitter and base electrodes, and means for supplying pulses from said transformer means to a point between said base electrode and said series circuit arrangement, said pulse supplying means comprising an impedance member having a relatively low impedance to the leading edges of said pulses and having a relatively high impedance at the repetition frequency of the said pulses.

References Cited by the Examiner

UNITED STATES PATENTS

| | | | |
|---|---|---|---|
| 2,193,850 | 3/1940 | Andrieu et al. | 331—146 |
| 2,250,706 | 7/1941 | Geiger | 331—146 |
| 2,358,297 | 9/1944 | Bedford | 331—146 |
| 2,748,274 | 5/1956 | Pearlman | 250—36—24 |
| 2,757,243 | 7/1956 | Thomas | 250—36—14 |
| 2,776,420 | 1/1957 | Woll | 250—36—24 |
| 2,783,380 | 2/1957 | Bonn | 250—36—24 |
| 2,783,384 | 2/1957 | Bright et al. | 250—36—24 |
| 2,843,815 | 7/1958 | Driver | 331—114 |
| 2,852,730 | 9/1958 | Magnuski | 331—113.1 |
| 2,854,614 | 9/1958 | Light | 331—112 |
| 2,873,371 | 2/1959 | Van Allen | 331—113.1 |

OTHER REFERENCES

Electronic Engineering, "A Time Base Oscillator," April 1954, page 168.

Article: "Operation of a Saturable Core Square Wave," by Mogen, from a publication of transistor division of Minneapolis-Honeywell Co., dated May 16, 1956.

Radio-Electronics, "Noise Generator," July 1954, page 85.

ROY LAKE, *Primary Examiner.*

JOHN E. LADY, SIMON YAFFEE, GEORGE N. WESTBY, *Examiners.*